United States Patent
Meguro et al.

(10) Patent No.: US 7,892,356 B2
(45) Date of Patent: Feb. 22, 2011

(54) DIAMOND COMPOSITE SUBSTRATE AND PROCESS FOR PRODUCING THE SAME

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 182 days.

(21) Appl. No.: 10/510,848

(22) PCT Filed: Jan. 22, 2004

(86) PCT No.: PCT/JP2004/000532

§ 371 (c)(1),
(2), (4) Date: Oct. 13, 2004

(87) PCT Pub. No.: WO2004/067812

PCT Pub. Date: Dec. 18, 2004

(65) Prior Publication Data

US 2005/0160968 A1  Jul. 28, 2005

(30) Foreign Application Priority Data

Jan. 28, 2003 (JP) ............................. 2003-018736

(51) Int. Cl.
*C30B 29/02* (2006.01)

(52) U.S. Cl. .................. 117/104; 117/101; 117/95; 117/929; 423/446

(58) Field of Classification Search .............. 117/101, 117/104, 929, 95; 423/446
See application file for complete search history.

(56) References Cited

U.S. PATENT DOCUMENTS 5,427,054 A  6/1995 Saito et al.

(Continued)

FOREIGN PATENT DOCUMENTS

EP  0 589 464 A1  3/1994

(Continued)

OTHER PUBLICATIONS

European Search Report issued in European Patent Application No. EP 04 70 4342, mailed Nov. 20, 2008.

(Continued)

*Primary Examiner*—Robert M Kunemund
(74) *Attorney, Agent, or Firm*—McDermott Will & Emery LLP

(57) ABSTRACT

It is an object of the present invention to provide a diamond substrate with high toughness, a large surface area, and high quality, for use in semiconductor materials, electronic components, optical components, and so forth, and a method for manufacturing this substrate.

A diamond polycrystalline film is laminated on the surface of a diamond monocrystalline substrate to create a diamond composite substrate. In said diamond composite substrate, it is preferable that the main face, which has the largest surface area of the diamond monocrystalline substrate, be the {100} plane, and the diamond polycrystalline film be laminated on the opposite face parallel to this face. The diamond monocrystalline substrate 3 may be made up of a plurality of diamond monocrystals having the same orientation of the main face, and these plurality of diamond monocrystals may be joined by a diamond crystal layer 4 to create a diamond composite substrate 2. The diamond monocrystals may also be used as seed crystals and diamond monocrystals provided by vapor phase synthesis on the surface thereof.

26 Claims, 3 Drawing Sheets

U.S. PATENT DOCUMENTS

| | | | | |
|---|---|---|---|---|
| 5,442,199 A | * | 8/1995 | Saito et al. | 257/77 |
| 5,645,937 A | | 7/1997 | Noda et al. | |
| 5,803,967 A | * | 9/1998 | Plano et al. | 117/102 |
| 5,804,321 A | * | 9/1998 | Thorpe et al. | 428/623 |

FOREIGN PATENT DOCUMENTS

| | | |
|---|---|---|
| JP | 1-208397 | 8/1989 |
| JP | 2-51413 | 2/1990 |
| JP | 3-75298 | 3/1991 |
| JP | 3-93695 | 4/1991 |
| JP | 06-072797 | 3/1994 |
| JP | 06-107494 | 4/1994 |
| JP | 06-172089 | 6/1994 |
| JP | 6-53638 | 7/1994 |
| JP | 7-48198 | 2/1995 |
| JP | 11-145056 | 5/1999 |

OTHER PUBLICATIONS

English Translation of JP 03-75298, Mar. 29, 1991.
English Translation of JP 03-93695, Apr. 18, 1991.
Japanese Office Action, with English concise explanation of relevance, issued in Japanese Patent Application No. 2005-504682, mailed May 10, 2010.

* cited by examiner

DIAMOND COMPOSITE SUBSTRATE AND PROCESS FOR PRODUCING THE SAME

TECHNICAL FIELD

This invention relates to a diamond composite substrate and to a method for manufacturing the same, and more particularly relates to a diamond substrate with a large surface area and high quality for use in semiconductor materials, electronic components, optical components, and so forth, and to a method for manufacturing this substrate.

BACKGROUND ART

Diamond has numerous outstanding properties not seen in other semiconductor materials, such as its high thermal conductivity, high electron/hole mobility, high dielectric breakdown field, low dielectric loss, and wide bandgap. In particular, recent years have witnessed the continued development of ultraviolet emitting elements that take advantage of wide bandgap, as well as field effect transistors and the like having excellent high frequency characteristics.

Manmade diamond monocrystals, which are usually produced by a high-temperature, high-pressure synthesis process, have excellent crystallinity and, because of a phonon-related thermal conduction mechanism that is different from that of metals, have a thermal conductivity that is at least 5 times that of copper at normal temperature. These features are put to use when these diamond monocrystals are used as a heat-spreading substrate that needs high performance and reliability. In contrast, with a diamond polycrystalline film, which is usually obtained by vapor phase synthesis, because of the effect of phonon scattering at the grain boundary, the thermal conductivity is only about half that of diamond monocrystals.

Meanwhile, a large diamond composite substrate is needed in order for diamond to be used in semiconductor applications. Because they have better crystallinity than naturally occurring monocrystals, diamond monocrystals obtained by a high-temperature, high-pressure process are also useful as semiconductor substrates. However, the ultra-high-pressure synthesis apparatus used in this high-temperature, high-pressure process is bulky and expensive, which means that there is a limit to how much the cost of manufacturing monocrystals can be reduced. Also, since the size of the resulting monocrystals is proportional to the apparatus size, a size on the order of 1 cm is the practical limit. In view of this, Japanese Patent Publication H3-75298 (Patent Document 1), for example, discloses a method for obtaining a diamond monocrystalline substrate that has a large surface area. In the method, a plurality of high-pressure phase substances having substantially the same crystal orientation are arranged, a substrate that will serve as a nucleus for vapor phase growth is formed, and monocrystals are grown over this by vapor phase synthesis, resulting in integrated, large monocrystals.

Japanese Patent Publication H2-51413 discusses a method in which at least two diamond surfaces are provided with a space in between, and then diamond or diamond-like crosslinks are grown between the diamond surfaces by chemical vapor deposition (CVD), thereby joining the diamond surfaces. Nevertheless, this joined diamond that has been crosslinked between two surfaces has a drawback in that when the surface is polished, polishing stress is concentrated at the joint interface, leading to separation at the joint.

Problems encountered when diamond monocrystals are used as a heat-spreading substrate are thermal strain and cracking, which are attributable to the difference in the coefficients of thermal expansion between diamond and the heat emitting material. Diamond has one of the lowest coefficients of thermal expansion of all substances, whereas semiconductor materials such as silicon and GaAs have coefficients of thermal expansion from 1.5 to several times that of diamond, so when the two are heated and soldered, for example, to join them, deformation and cracking occur during cooling. In particular, diamond monocrystals have a large Young's modulus and are resistant to deformation, which conversely makes them a brittle material with low toughness. Specifically, the drawback to diamond monocrystals is that when they are subjected to a force, they tend to cleave along their {111} plane. Accordingly, there has also been practical application of heat-spreading substrates that feature polycrystalline diamond, which has higher toughness than monocrystals. Still, the thermal conductivity of monocrystals cannot be matched by the above-mentioned diamond polycrystalline film alone.

The inventors conducted the method for obtaining large monocrystals discussed in the above-mentioned Patent Document 1 in order to examine any problems encountered with this method, and found that the following problem occurs. A monocrystalline substrate consisting of a plurality of layers serving as nuclei for vapor phase growth usually does not have exactly the same orientation of the growth planes, which each layer having a slightly different planar orientation. When monocrystalline vapor phase growth is conducted in this state and the monocrystals are integrated, the joined portions thereof have growth boundaries of different angles, called small angle boundaries, which are defects in the broad sense, and these basically do not disappear no matter how long the monocrystalline growth is continued.

The inventors used a Raman scattering spectroscope to examine in detail the area around this small angle boundary, and as a result measured a peak shift that is different from that of an ordinary diamond peak. Specifically, what they found was not the ordinary diamond monocrystal peak near 1332 $cm^{-1}$, but rather the presence of a micro-region shifted a few $cm^{-1}$ higher or lower in the vicinity of the monocrystal connection boundary. They also found that when monocrystalline growth was continued in this same state, the monocrystals came apart during vapor phase growth around the monocrystal connection boundary at roughly the point when the film thickness exceeded 100 μm. From these two facts they recognized a problem in that when large monocrystals are formed by the above-mentioned prior art, stress accumulates near the small angle boundaries, and the monocrystals come apart around these boundaries at or over a certain film thickness.

DISCLOSURE OF THE INVENTION

The present invention was conceived in an effort to overcome the above problems encountered with prior art, and it is an object thereof to provide a diamond substrate with high toughness, a large surface area, and high quality, for use in semiconductor materials, electronic components, optical components, and so forth, and a method for manufacturing this substrate.

In order to achieve the stated object, the present invention has the following aspects (1) to (23).

(1) A diamond composite substrate, comprising: a diamond monocrystalline substrate; and a diamond polycrystalline film laminated thereon by a vapor phase synthesis.

(2) A diamond composite substrate according to (1) above, wherein a difference between an orientation of a main face, which has a largest surface area of the diamond monocrystalline substrate, and an orientation of a {100} plane is no more than 5 degrees, and the diamond polycrystalline film is laminated to an opposite face parallel to said main face.

(3) A diamond composite substrate according to (2) above, wherein the main face is the {100} plane.

(4) A diamond composite substrate according to any of (1) to (3) above, wherein a spacing between the main faces, which is a thickness of the diamond monocrystalline substrate, is at least 0.1 mm and no more than 1 mm.

(5) A diamond composite substrate according to any of (1) to (4) above, wherein a thickness of the diamond polycrystalline film laminated over the diamond monocrystalline substrate is at least 0.1 mm and no more than 1 mm.

(6) A diamond composite substrate according to any of (1) to (5) above, wherein a ratio of the thickness of the diamond monocrystalline substrate to the thickness of the diamond polycrystalline film is between 1:1 and 1:4.

(7) A diamond composite substrate according to any of (1) to (6) above, wherein the diamond monocrystalline substrate is made up of a plurality of diamond monocrystals all having a same orientation of the main face having the largest surface area, and these plurality of diamond monocrystals are joined by the diamond polycrystalline film formed by the vapor phase synthesis over said diamond monocrystals.

(8) A diamond composite substrate according to any of (1) to (7) above, wherein the difference between orientations of the plurality of diamond monocrystals in a direction of rotation with respect to an axis perpendicular to the main faces thereof is no more than 2 degrees, and the difference between the orientations of the respective main faces and the orientation of the {100} plane is no more than 5 degrees.

(9) A diamond composite substrate according to (8) above, wherein the orientation of the main faces of the plurality of diamond monocrystals is {100}.

(10) A diamond composite substrate according to any of (7) to (9) above, wherein a difference in thickness between the respective diamond monocrystals is no more than 10 μm.

(11) A diamond composite substrate according to any of (7) to (10) above, wherein a gap between the plurality of diamond monocrystals is no more than 500 μm.

(12) A diamond composite substrate, wherein a diamond monocrystalline substrate is made up of a plurality of diamond monocrystals in which a difference between orientations of the diamond monocrystals in a direction of rotation with respect to an axis perpendicular to main faces thereof is no more than 2 degrees, and a difference between orientations of the respective main faces and an orientation of a {100} plane is no more than 5 degrees, the diamond monocrystals are joined by a diamond polycrystalline film formed by a vapor phase synthesis on an opposite face parallel to the respective main faces of the diamond monocrystals, and an entire surface of said main face is integrated by vapor-phase synthesized diamond monocrystals grown using the diamond monocrystalline substrate as a seed crystal.

(13) A diamond composite substrate according to (12) above, wherein the orientation of the main faces of the plurality of diamond monocrystals is {100}.

(14) A diamond composite substrate according to (12) or (13) above, wherein a spacing between the main faces, which is a thickness of the plurality of diamond monocrystalline substrates, is at least 0.1 mm and no more than 1 mm.

(15) A diamond composite substrate according to any of (12) to (14) above, wherein a thickness of the diamond polycrystalline film formed by the vapor phase synthesis over the diamond monocrystals is at least 0.1 mm and no more than 1 mm.

(16) A diamond composite substrate according to any of (12) to (15) above, wherein a ratio of the thickness of the diamond monocrystals to the thickness of the diamond polycrystalline film is between 1:1 and 1:4.

(17) A diamond composite substrate according to any of (12) to (16) above, wherein a gap between the plurality of diamond monocrystals is no more than 500 μm.

(18) A diamond composite substrate according to any of (12) to (17) above, wherein a difference in the thickness between the plurality of diamond monocrystals is no more than 10 μm.

(19) A diamond composite substrate according to (12) to (18) above, wherein a surface of the diamond polycrystalline film has been polished.

(20) A diamond composite substrate according to any of (12) to (19), wherein a surface roughness Rmax of the diamond polycrystalline film is no more than 0.1 μm.

(21) A method for manufacturing a diamond composite substrate, wherein a plurality of diamond monocrystals having a same orientation are lined up, a diamond polycrystalline film is formed by a vapor phase synthesis over said monocrystals, and the plurality of diamond monocrystals are joined by the diamond polycrystalline film.

(22) A method for manufacturing a diamond composite substrate according to (21) above, wherein a deviation between orientations of the plurality of diamond monocrystals in a direction of rotation with respect to an axis perpendicular to main faces thereof, which has a largest surface area, is no more than 2 degrees, and a difference between orientations of the respective main faces and an orientation of a {100} plane is no more than 5 degrees.

(23) A method for manufacturing a diamond composite substrate according to (22) above, wherein the main face having the largest surface area of the faces that make up the diamond monocrystals is the {100} plane.

(24) A method for manufacturing a diamond composite substrate according to any of (21) to (23) above, wherein an thickness of the diamond monocrystals is at least 0.1 mm and no more than 1 mm.

(25) A method for manufacturing a diamond composite substrate according to any of (21) to (24) above, wherein a thickness of the diamond polycrystalline film formed by the vapor phase synthesis over the diamond monocrystals is at least 0.1 mm and no more than 1 mm.

(26) A method for manufacturing a diamond composite substrate according to any of (21) to (25) above, wherein a ratio of the thickness of the diamond monocrystals to the thickness of the diamond polycrystalline film is between 1:1 and 1:4.

(27) A method for manufacturing a diamond composite substrate according to any of (21) to (26) above, wherein a difference in thickness between the plurality of diamond monocrystals is no more than 10 μm.

(28) A method for manufacturing a diamond composite substrate according to any of (21) to (27), wherein a gap between the plurality of diamond monocrystals is no more than 500 μm.

The above aspects (1) to (28) of the present invention will now be described.

In this Specification, the term "diamond monocrystalline substrate" is used not only to mean a substrate composed of just one monocrystal, but also to mean a substrate made up of a plurality of monocrystals.

Aspect (1)

Laminating a diamond monocrystalline substrate having high thermal conductivity and a diamond polycrystalline film having high toughness that is formed by vapor phase synthesis over this monocrystalline substrate yields a diamond composite substrate that combines high thermal conductivity with high toughness. The diamond monocrystals here may be natural diamond monocrystals, manmade diamond monocrystals obtained by a high-temperature, high-pressure process, or vapor deposited diamond monocrystals, or they may be diamond monocrystals manufactured by some other method.

Aspects (2) and (3)

When a diamond composite substrate is put to use, the side of the monocrystals opposite the side where diamond polycrystalline film is laminated will be used in such actual applications as semiconductor applications or a contact surface for a heat-spreading substrate. In this case, it is better for the monocrystal surface to comprise the {100} plane, which is relatively soft and lends itself well to working.

Also, the diamond composite substrate of the present invention may be characterized in that the deviation between the orientations of the diamond monocrystals is no more than 5 degrees from {100}. When practical application is considered, it is preferable for the main face of the monocrystals to be {100} as mentioned above. But, as a result of in-depth study into deviation of the orientation of the main face, the inventors have revealed that there will be no problems in subsequent semiconductor applications or polishing as long as the deviation from the {100} plane is within 5 degrees.

Aspects (4) and (6)

The diamond composite substrate of the present invention may also be characterized in that the thickness of the diamond monocrystals is at least 0.1 mm and no more than 1 mm, the thickness of the diamond polycrystalline film laminated over the diamond monocrystalline substrate is at least 0.1 mm and no more than 1 mm, and the ratio of the thickness of the diamond monocrystalline substrate to the thickness of the diamond polycrystalline film is between 1:1 and 1:4. If the primary intent is application to a heat-spreading substrate, since the thermal conductivity and toughness of a diamond composite substrate are in a reciprocal relationship, there are optimal ranges for the thickness of the monocrystal layers, the thickness of the polycrystalline layers, and the ratio thereof. The inventors have discovered that high toughness can be attained by keeping these numerical values within the above-mentioned ranges while maintaining adequate thermal conductivity.

Aspect (7)

The diamond composite substrate of the present invention may also be characterized in that the diamond monocrystalline substrate is made up of a plurality of diamond monocrystals all having the same orientation of the main face, and these diamond monocrystals are joined by the diamond polycrystalline film formed by vapor phase synthesis over said diamond monocrystals. As discussed above, if monocrystals are grown by vapor phase directly from a monocrystalline substrate composed of a plurality of monocrystals, the substrate may come apart because of the concentration of stress at the boundaries. However, this falling apart will not occur if the monocrystals are joined by a polycrystalline film, and the result will be a large, substantially integrated composite substrate. The diamond polycrystalline film does not necessarily have to be formed on the sides faces of the monocrystals, and the monocrystals may be joined by the polycrystals formed on the main face.

Aspects (8) and (9)

The diamond composite substrate of the present invention may also be characterized in that the deviation between the orientations of the diamond monocrystals that make up the diamond monocrystalline substrate in the direction of rotation with respect to the axis perpendicular to the main faces thereof is no more than 2 degrees, and, the orientation of the main faces of the diamond monocrystals is {100} or the deviation of the main faces of the diamond monocrystalline substrate from the orientation of the {100} plane is no more than 5 degrees. If a plurality of monocrystals are used, the deviation in the orientations will be in two dimensions, in the vertical and rotational directions. If the intended application is one in which these monocrystals are joined and integrated by a polycrystalline film, then the workability and other physical properties of the monocrystals must be the same on all the substrates, and there will be a permissible range of deviation of the previously mentioned orientation. The inventors have found that the properties of a composite substrate can be stabilized by keeping the deviation of the orientations of the various monocrystals within the above-mentioned range.

Aspects (10) and (11)

The diamond composite substrate of the present invention may also be characterized in that the difference in thickness between the diamond monocrystals that make up the diamond monocrystalline substrate is no more than 10 µm, and the gap between the diamond monocrystals is no more than 500 µm. In an application in which a plurality of diamond monocrystals are integrated by a polycrystalline film, the difference in thickness between the monocrystals and the gaps therebetween should be as small as possible. On the other hand, arrangement will be difficult if the gaps between monocrystals are too small when integration is accomplished by vapor phase synthesis, and problems will also be encountered in production of larger composite substrates, so for practical purposes a gap of at least 150 µm is preferable. As a result of studying various applications, the inventors have found that a diamond composite substrate with no practical problems can be obtained by keeping these values within the numerical ranges given above.

Aspect (12) to (20)

The diamond composite substrate of the present invention is characterized in that a diamond monocrystalline substrate is made up of a plurality of diamond monocrystals in which the orientation of the main faces of the various diamond monocrystals is {100}, or the difference between the orientations of main faces and the orientation of the {100} plane is no more than 5 degrees, the diamond monocrystals are joined by a diamond polycrystalline film formed on the opposite face parallel to the main face of the diamond monocrystals, and the entire surface of the main face is integrated by vapor-phase synthesized diamond monocrystals grown using the diamond monocrystals as seed crystals. As discussed above, when the monocrystals are joined by vapor phase growth directly from a plurality of diamond monocrystals, they may come apart under stress. However, if one side is joined with a polycrystalline film and the other side has a structure integrated by monocrystals grown in the vapor phase, this problem of falling apart is completely eliminated. These integrated, vapor-phase synthesized diamond monocrystals can be applied as a large monocrystalline substrate. It is preferable if the thickness of the diamond monocrystals is at least 0.1 mm and no more than 1 mm, the thickness of the diamond polycrystalline film formed by vapor phase synthesis over the diamond monocrystals is at least 0.1 mm and no more than 1 mm, and the ratio of the thickness of the diamond monocrystals to the thickness of the diamond polycrystalline film is between 1:1 and 1:4. It is also preferable if the difference in thickness between the plurality of diamond monocrystals is no more than 10 µm, and the gap between the diamond monocrystals is no more than 500 µm. A high-quality diamond substrate with a large surface area, which is the object of the present invention, can be obtained by keeping the size and arrangement of the monocrystals and polycrystalline layer within the ranges given above. It is also preferable, from the standpoint of subsequent application, if the surface of the diamond polycrystalline film has been polished and the surface roughness Rmax thereof is no more than 0.1 µm.

Aspect (21) to (23)

The method of the present invention for manufacturing a diamond composite substrate is characterized in that a plurality of diamond monocrystals having the same orientation are lined up, a diamond polycrystalline film is formed by vapor phase synthesis over these monocrystals, and the diamond monocrystals are joined by the diamond polycrystalline film thus produced. In a manufacturing method for joining monocrystals with a polycrystalline film by forming said polycrystalline film over a diamond monocrystalline substrate composed of a plurality of layers, if diamond monocrystals having the same orientation are readied, and a polycrystalline film is grown thereon by vapor phase synthesis, then the resulting diamond composite substrate can be applied as a high-quality diamond composite substrate with a large surface area. Further, it is preferable if the main face having the largest surface area of the faces that make up the diamond monocrystalline substrate is the {100} plane, and if the deviation between the orientations of the monocrystals in the direction of rotation with respect to the axis perpendicular to the main faces is no more than 2 degrees, and the deviation of the orientations of the main faces from the {100} plane is no more than 5 degrees.

Aspect (24) to (28)

It is preferable if the thickness of the diamond monocrystals is at least 0.1 mm and no more than 1 mm, the thickness of the diamond polycrystalline film formed by vapor phase synthesis over the diamond monocrystals is at least 0.1 mm and no more than 1 mm, and the ratio of the thickness of the diamond monocrystals to the thickness of the diamond polycrystalline film is between 1:1 and 1:4. It is also preferable if the difference in thickness between the diamond monocrystals is no more than 10 µm, and the gap between the diamond monocrystals is no more than 500 µm. Production of the high-quality diamond substrate with a large surface area, which is the object of the present invention, can be facilitated by keeping the conditions for the monocrystals and the polycrystalline layer within the ranges given above.

BEST MODE FOR CARRYING OUT THE INVENTION

The present invention will now be described in detail on the basis of examples, but the scope of the present invention is not limited in any way by the following examples.

EXAMPLE 1

Figure 1:
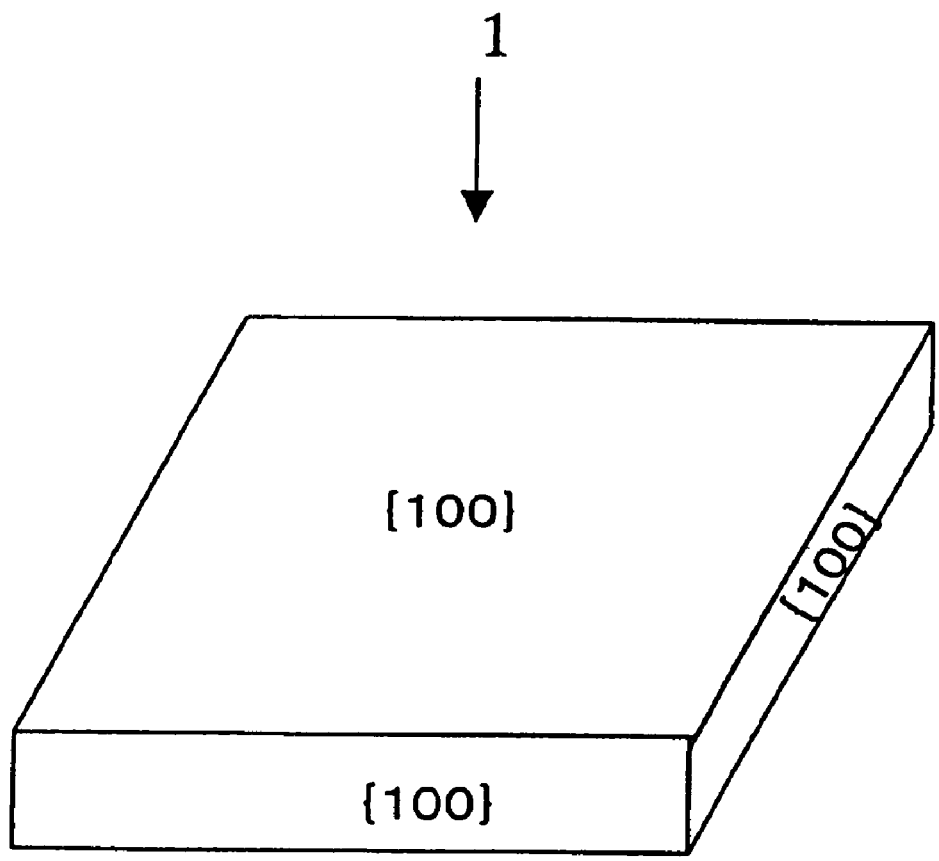
FIG. 1 is a simplified view of the diamond monocrystalline substrate used in the present invention.
Figure 1:
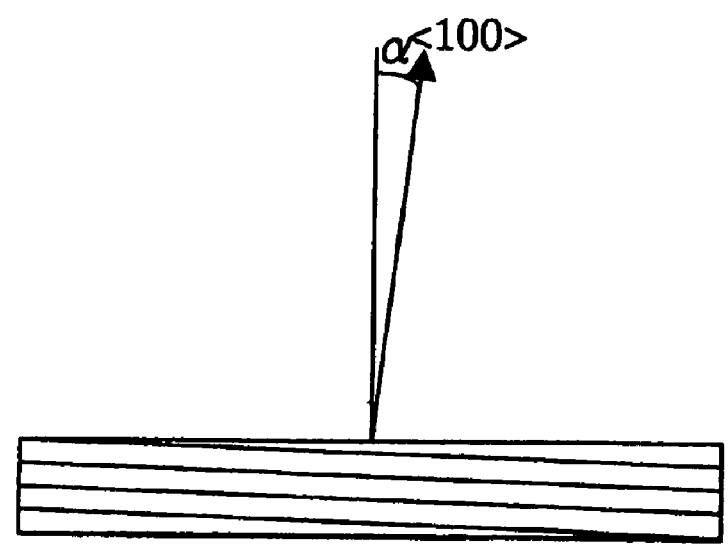

In this example we will describe one possible structure of a diamond composite substrate, in which a diamond polycrystalline film is laminated over a diamond monocrystalline substrate composed of a single monocrystal. First, the cubic diamond monocrystalline substrate shown in FIG. 1 was readied, in which the thickness was 0.5 mm, the lengths of the two sides perpendicular to the thickness direction were both 10 mm, and the orientation of the all six faces was {100}. This monocrystalline substrate was cut out of monocrystal in the rough, called type Ib, containing nitrogen as an impurity and manufactured by a high-temperature, high-pressure synthesis process. The deviation (the angle α in FIG. 1) of the orientation of the main face having the largest surface area from {100} was measured by X-ray Laue method and found to be 1.9 degrees. A diamond polycrystalline film was formed by a known microwave CVD process over this diamond monocrystalline substrate. The polycrystalline film growth conditions were as shown in Table 1.

TABLE 1

| Polycrystalline film growth conditions | |
| --- | --- |
| Microwave frequency | 2.45 GHz |
| Microwave power | 5 kW |
| Chamber pressure | $1.33 \times 10^4$ Pa |
| $H_2$ gas flow | 100 sccm |
| $CH_4$ gas flow | 2 sccm |
| Substrate temperature | 980° C. |
| Growth time | 250 hours |

No monocrystal layer was present in the region of film formation after growth, and the substrate region (monocrystal) was clearly distinct from the film formation region (polycrystalline film). The thickness of the polycrystalline layer was 0.5 mm. This substrate ("substrate 1") was evaluated by the following methods for toughness and thermal conductivity. First, toughness was evaluated by the three-point bending resistance test set forth in JIS R 1601. The bending direction was the direction in which tensile stress acted to the monocrystal side. The evaluation conditions were as shown in Table 2.

TABLE 2

| Toughness evaluation conditions | |
| --- | --- |
| Cross head speed | 0.5 mm/min |
| Load cell | 500 kgf × 1/50 |
| Span | 4 mm three-point bending |

Figure 2:
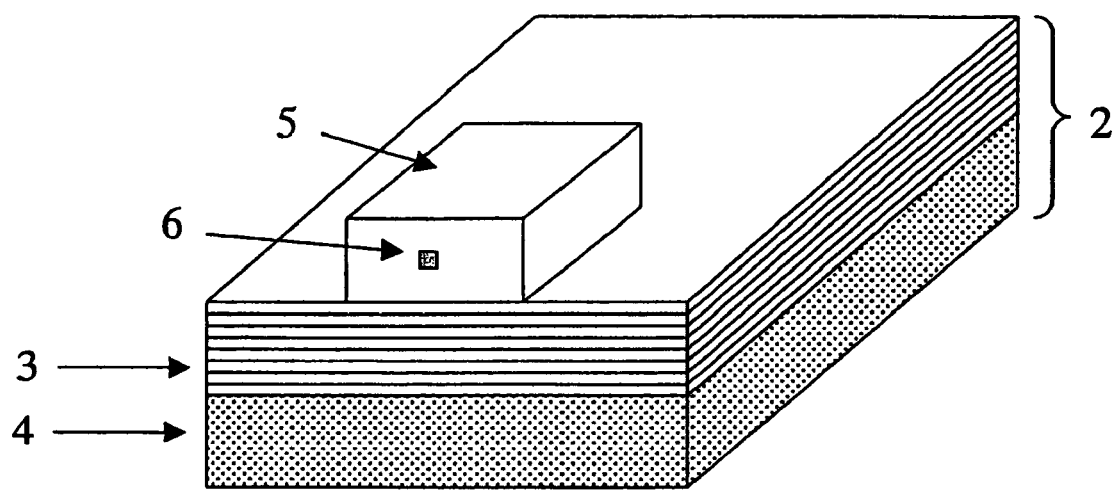
FIG. 2 is a simplified view of a thermal conduction test conducted using the diamond composite substrate of the present invention.

The bending resistance of substrate 1 was measured and found to be 1240 MPa. Next, thermal conductivity was evaluated from the cooling effect of the heat-spreading portion when substrate 1 was used as a heat-spreading substrate for a high-output laser diode (LD). FIG. 2 shows a schematic view of the thermal conduction test. The laser was oscillated in a state in which the LD (comprising a GaAs layer 5) had been soldered to the monocrystal side of a diamond composite substrate 2 consisting of a diamond monocrystalline layer 3 and a diamond polycrystalline layer 4, and the maximum temperature of a laser heating portion 6 was measured. The evaluation conditions employed in the thermal conduction test are shown in Table 3.

TABLE 3

| Thermal conductivity evaluation conditions | |
|---|---|
| LD heat generation | 600 mW |
| Heating portion | 1 × 1 × 300 μm |
| Diamond polycrystalline side | 20° C. air cooled |

Measurements revealed that the maximum temperature of the LD heating portion was 75° C., and laser output was also normal.

Next, a diamond monocrystalline substrate alone, a diamond polycrystal alone, and diamond composite substrates of varied thickness were subjected to the same toughness and thermal conduction tests.

Table 4 shows the structure of the diamond monocrystalline substrate and test results. The size of the main face of the diamond monocrystalline substrate was 10 mm square in every case, which is the same as that of substrate 1, the orientation was {100}, and α (which indicates deviation of orientation) was no more than 2 degrees except in the case of substrate 9. The conditions under which the polycrystalline film was formed were all the same as in Table 1.

TABLE 4

| | | | Test results | | | |
|---|---|---|---|---|---|---|
| Substrate No. | Monocrystal thickness (mm) | Polycrystal thickness (mm) | Angle α (deg) | Bending resistance (MPa) | Heating portion temp. (° C.) | Laser output |
| 1 | 0.5 | 0.5 | 1.9 | 1240 | 75 | normal |
| 2 | 1.0 | 0 | 1.8 | 260 | 69 | normal |
| 3 | 0 | 1.0 | 1.1 | 1440 | 86 | decrease |
| 4 | 0.25 | 0.75 | 1.3 | 1380 | 81 | normal |
| 5 | 0.15 | 0.8 | 0.5 | 1400 | 84 | decrease |
| 6 | 0.7 | 0.3 | 1.5 | 510 | 72 | normal |
| 7 | 0.09 | 0.09 | 1.9 | 180 | 59 | normal |
| 8 | 1.1 | 1.1 | 2.0 | 1670 | 95 | decrease |
| 9 | 0.5 | 0.5 | 5.5 | 1130 | 76 | normal |

In Table 4, substrates 2 and 3 are a diamond monocrystalline substrate and a diamond polycrystalline substrate, respectively, and the test results for these are given in Table 4. Since substrate 2 is monocrystals alone, thermal conductivity is higher and there is a decrease in the temperature of the heating portion. But, bending resistance decreases to only about one-fifth that of the composite substrate of substrate 1. This makes this substrate difficult to use in applications that demand good toughness. Since substrate 3 is polycrystals alone, the bending resistance is higher than with substrate 1, but the thermal conductivity is lower and there is an increase in the heating portion temperature. As a result, a decrease in the laser output was noted.

Next, substrates 4 to 6 have varied thickness (ratio) of the monocrystals and polycrystalline film, allowing a comparison of the performance thereof. As already discussed, the toughness and thermal conductivity of a diamond composite substrate are in a reciprocal relationship, which is obvious from Table 4 as well. Specifically, with substrates 5 and 6, there was a pronounced drop in bending resistance or laser output (heating portion temperature), and it can be seen that there was a decrease in the superiority of a diamond substrate. Substrates 7 and 8 represent a comparison of the change in performance when the substrate thickness was varied.

With substrate 7, both the monocrystals and the polycrystalline film are thinner than preferable, the result being good heat radiation but a decrease in bending resistance, so that the substrate cannot be used in applications demanding high toughness. Conversely, with substrate 8, the monocrystals and the polycrystalline film were both thicker than preferable then the thermal resistance will increase though the toughness is exhibited. Moreover, the drawback that is higher manufacturing cost arises. Finally, with substrate 9, the effect was examined in the case that the main face of the monocrystals deviated by more than 5 degrees from {100}. In this case, the bending resistance was slightly lower than that of substrate 1, but the results posed no real problem, including those for thermal conductivity. However, in a polishing test conducted separately, the polishing rate of the monocrystal face dropped to two-thirds that of substrate 1, so there was a problem in terms of workability.

Thus, the diamond monocrystal/polycrystalline film composite substrate represented by substrate 1 was shown to be useful as a heat-spreading substrate that possesses both high toughness and high thermal conductivity.

EXAMPLE 2

In this example we will describe a case in which a diamond polycrystalline film is laminated over a plurality of diamond monocrystals having the same orientation, so that these monocrystals are integrally joined, and a case in which diamond monocrystals are subsequently grown by vapor phase deposition on the monocrystal surface.

Figure 3:
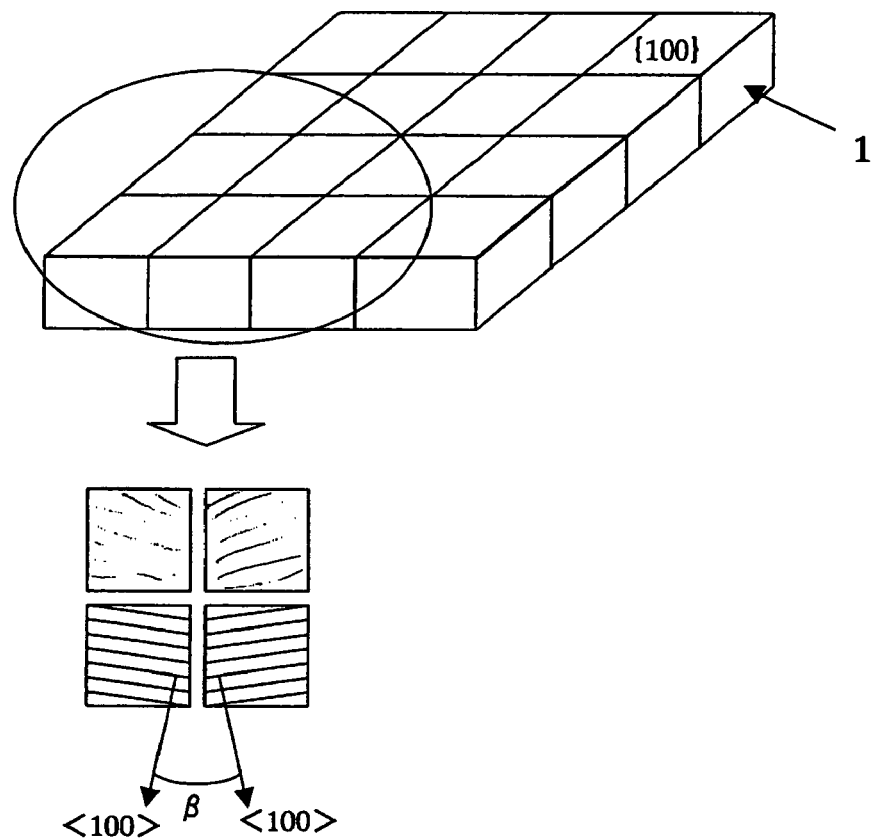
FIG. 3 is a diagram of the layout of diamond monocrystalline substrates for manufacturing the diamond composite substrate of the present invention.

First, 16 sheets of type Ib diamond monocrystals obtained by high-temperature, high-pressure synthesis were readied. The size of the monocrystals was 4 mm long and wide and 0.5 mm thick, and the main faces were polished. The main and side faces all had an orientation of {100}, and α (indicating the deviation of the orientation of the main face) was no more than 2 degrees. These monocrystals were arranged on a substrate holder so that their side faces coincided as shown in FIG. 3. The orientational deviation in the direction of rotation with respect to the axis perpendicular to the main face (β in FIG. 3; the lower drawing in FIG. 3 is a view from above of the portion enclosed by the oval in the upper drawing) was no more than 1 degree for any of the adjacent monocrystals. The difference in thickness was 10 μm at most, and the maximum gap between monocrystals was 90 μm.

Figure 4:
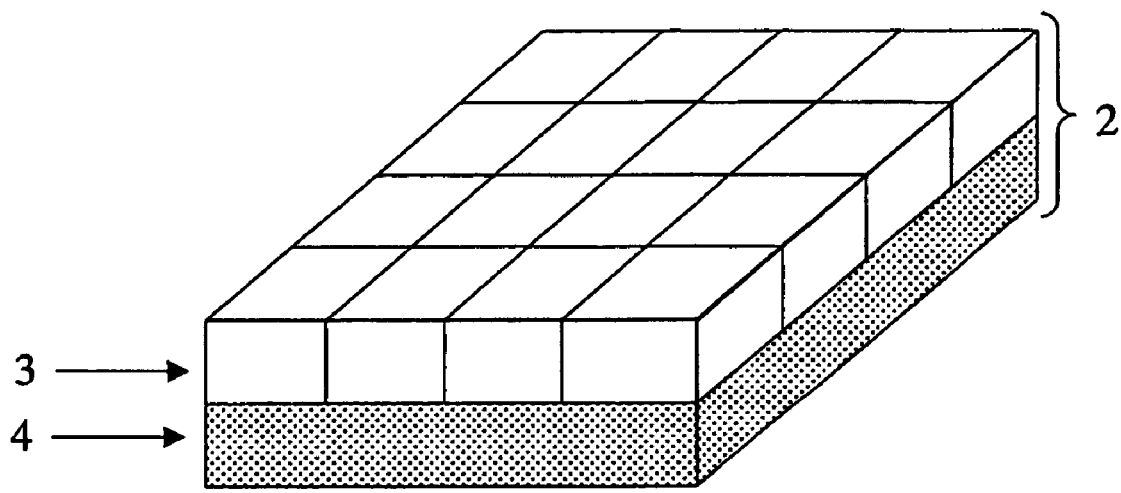
FIG. 4 is a simplified view of a large diamond composite substrate manufactured with the present invention.

The diamond polycrystalline film 4 was formed by microwave plasma CVD under the same conditions as those given in Table 1 of Example 1 over a diamond monocrystalline substrate 1 composed of these plurality of monocrystals. As a result, as shown in FIG. 4, a diamond composite substrate 2 in which 16 layers of monocrystals had been integrally joined by the polycrystalline layer 4 with the thickness of the polycrystalline film being 0.5 mm was obtained (this will be termed substrate 10).

After this, the polycrystalline side of this substrate 10 was polished and smoothed to a surface roughness Rmax of 0.09 μm. Monocrystals were then grown by vapor phase deposition by a known microwave plasma CVD on the monocrystalline side. The growth conditions are shown in Table 5.

TABLE 5

| Monocrystal growth conditions | |
|---|---|
| Microwave frequency | 2.45 GHz |
| Microwave power | 5 kW |
| Chamber pressure | $1.33 \times 10^4$ Pa |
| $H_2$ gas flow | 100 sccm |
| $CH_4$ gas flow | 5 sccm |
| Substrate temperature | 900° C. |
| Growth time | 100 hours |

Figure 5:
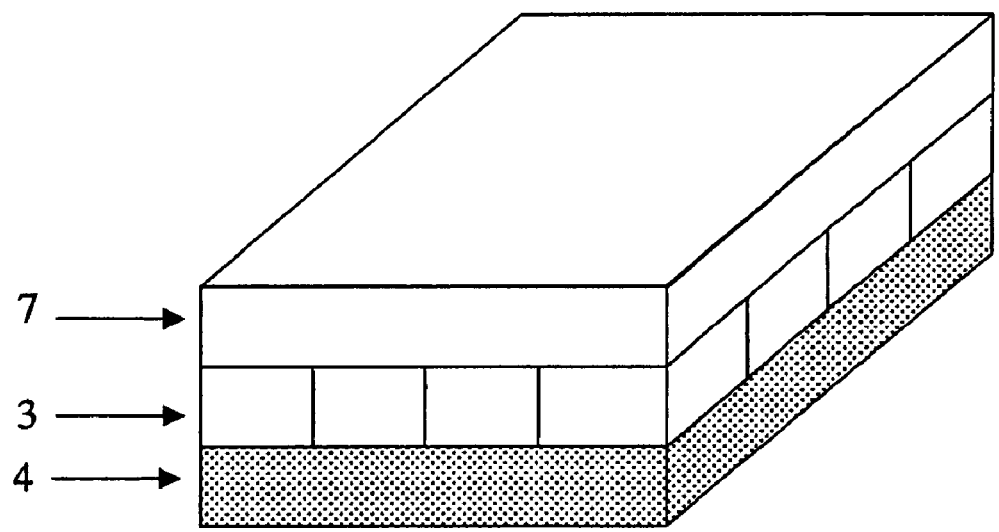
FIG. 5 is an example of producing a large diamond monocrystalline substrate using the diamond composite substrate of the present invention.

After growth, the vapor phase monocrystalline films grown from individual monocrystals had a thickness of 0.5 mm, and these were integrally joined to create a single, large monocrystalline substrate (FIG. 5). After this, the monocrystalline substrate portion composed of a plurality of layers and the polycrystalline film were removed by polishing, which gave large, vapor-phase synthesized diamond monocrystals measuring 16 mm square and having a thickness of 0.5 mm.

Other composite substrate samples besides the substrate 10 included on in which the deviations α and β of the planar orientation of the monocrystals were varied, ones in which the thickness of the monocrystals and the polycrystalline film was varies, ones in which the difference in thickness between the monocrystals was varied, ones in which the gap between monocrystals was varied, and ones in which the surface roughness of the polycrystalline film side was varied (i.e., whether or not polishing was performed) (substrates 11 to 20). The production conditions for these substrates are compiled in Table 6.

was polished. Also, since stress accumulates when monocrystals are grown by vapor phase deposition without the polycrystalline layer being polished with an equal substrate, cracking was noted in the vapor phase monocrystals.

With substrate 15, which had a large different in the thickness of the monocrystals, a step was present on the polycrystalline layer side at the point when the polycrystalline layer was formed. Consequently, stress accumulated and cracking occurred during polishing of the polycrystal face. Also, when an equal substrate was turned over, without any polishing being performed, and monocrystals were grown by vapor phase deposition on the monocrystal face, the temperature distribution resulting from the step prevented integrated vapor phase growth.

With substrate 16, which had a somewhat larger gap between substrates, the same diamond composite substrate as with substrate 10 could be obtained. Furthermore, when monocrystals were grown by vapor phase deposition from monocrystals of substrate 16, the larger gap resulted in a corresponding increase in size compared to that with substrate 10, resulting in large vapor-phase synthesized diamond monocrystals measuring 16.5 mm square and 0.5 mm in thickness.

With substrate 17, which had an even larger gap between substrates, some cracking occurred as a result of stress concentration at the interface during polishing of the polycrystalline layer, but the polishing could be completed without decomposition. With substrate 18, which had a gap that was larger yet, cracking and decomposing occurred during polishing of the polycrystalline layer, and polishing could not be completed. Also, when monocrystals were grown by vapor

TABLE 6

| Substrate No. | Angle α (deg) | Angle β (deg) | Monocrystal thickness (mm) | Polycrystal thickness (mm) | Maximum thickness difference (μm) | Maximum gap between substrates (μm) | Polycrystal side surface roughness Rmax (μm) |
|---|---|---|---|---|---|---|---|
| 10 | 1.8 | 0.9 | 0.5 | 0.5 | 10 | 90 | 0.09 |
| 11 | 5.3 | 0.6 | 0.5 | 0.5 | 10 | 85 | 0.09 |
| 12 | 1.9 | 2.2 | 0.5 | 0.5 | 10 | 94 | 0.09 |
| 13 | 2.7 | 0.8 | 0.09 | 0.5 | 8 | 87 | 0.09 |
| 14 | 3.9 | 0.9 | 0.5 | 0.09 | 10 | 98 | [*1] |
| 15 | 1.5 | 1.1 | 0.5 | 0.5 | 13 | 84 | [*1] |
| 16 | 1.7 | 0.8 | 0.5 | 0.5 | 9 | 150 | 0.09 |
| 17 | 4.1 | 1.9 | 0.5 | 0.5 | 9 | 490 | 0.09[*2] |
| 18 | 2.3 | 0.9 | 0.5 | 0.5 | 8 | 510 | [*1] |
| 19 | 3.5 | 1.5 | 0.5 | 0.5 | 8 | 89 | [*3] |
| 20 | 2.6 | 0.8 | 0.5 | 0.5 | 9 | 91 | 0.15 |

[*1: (could not be polished) *2: (some cracking) *3: could not be measured (unpolished)]

For composite substrates 11 to 20, vapor-phase synthesized diamond monocrystals were produced under the same conditions as for substrate 10 on the monocrystal side. With substrates 11 and 12, there was considerable deviation in the orientation of different monocrystals, abnormal growth occurred frequently at the connection interface of the vapor phase monocrystals, and monocrystal growth that resulted in complete integration could not be achieved.

As to substrate 13, because of the thinness of the monocrystals, it was noted that the joined composite substrate warped at the point when the initial polycrystalline layer was formed. Accordingly, vapor phase growth that resulted in integration could not be achieved even in subsequent monocrystal vapor phase growth.

As to substrate 14, the polycrystalline layer was thin, and cracking occurred at the point when the polycrystalline layer phase deposition on the monocrystal face without polishing with an equal substrate to substrate 18, abnormal growth occurred from the gaps between the monocrystalline substrates, and monocrystal growth that resulted in integration over the entire surface could not be achieved.

Finally, with substrate 19, which was not polished on the polycrystalline face, and substrate 20, which had a rough polycrystalline face, there was a temperature distribution for each monocrystal during monocrystals vapor phase growth, and vapor phase growth that resulted in integration over the entire surface could not be achieved.

As discussed above, a diamond composite substrate manufactured by the method represented by substrate 10 was shown to be useful as a seed substrate for obtaining a diamond monocrystalline substrate having a large surface area and good crystallinity.

INDUSTRIAL APPLICABILITY

As described above, when the diamond composite substrate pertaining to the patent invention, and the method for manufacturing the same, can be utilized in semiconductor materials, electronic components, optical components, and so forth as a heat-spreading substrate that combines high thermal conductivity with high toughness, or as a high-quality diamond monocrystalline substrate with a large surface area.

The invention claimed is:

1. A diamond composite substrate, comprising:
 a diamond monocrystalline substrate having first and second opposed main faces; and
 a diamond polycrystalline film having crystals with random orientation laminated thereon by a vapor phase synthesis,
 wherein the diamond monocrystalline substrate having a thickness defined by a spacing between the main faces to be at least 0.1 mm and no more 1 mm.

2. A diamond composite substrate according to claim 1, wherein a difference between an orientation of the first main face, which has a largest surface area of the diamond monocrystalline substrate and an orientation of a {100} plane is no more than 5 degrees, and
 the diamond polycrystalline film is laminated on the second main face parallel to the first face.

3. A diamond composite substrate according to claim 2, wherein the first main face is the {100} plane.

4. A diamond composite substrate according to claim 1, wherein a thickness of the diamond polycrystalline film laminated over the diamond monocrystalline substrate is at least 0.1 mm and no more than 1 mm.

5. A diamond composite substrate according to claim 1, wherein a ratio of the thickness of the diamond monocrystalline substrate to the thickness of the diamond polycrystalline film is between 1:1 and 1:4.

6. A diamond composite substrate according to claim 1, wherein the diamond monocrystalline substrate is made up of a plurality of diamond monocrystals all having a same orientation of the first main face having the largest surface area, and
 the plurality of diamond monocrystals are joined by the diamond polycrystalline film formed by the vapor phase synthesis over the diamond monocrystals.

7. A diamond composite substrate according to claim 1 wherein the difference between orientations of faces of the plurality of diamond monocrystals in a direction of rotation with respect to an axis perpendicular to the faces thereof is no more than 2 degrees, and
 the difference between the orientations of the faces of the plurality of diamond monocrystals and the orientation of the {100} plane is no more than 5 degrees.

8. A diamond composite substrate according to claim 7, wherein the orientation of the faces of the plurality of diamond monocrystals is {100}.

9. A diamond composite substrate according to claim 6, wherein a difference in thickness between the respective diamond monocrystals is no more than 10 µm.

10. A diamond composite substrate according to claim 6, wherein a gap between the plurality of diamond monocrystals is no more than 500 µm.

11. A diamond composite substrate, wherein a diamond monocrystalline substrate having first and second opposed main faces is made up of a plurality of diamond monocrystals in which a difference between orientations of the diamond monocrystals in a direction of rotation with respect to an axis perpendicular to faces of the diamond monocrystals is no more than 2 degrees,
 a difference between orientations of the faces of the plurality of diamond monocrystals and an orientation of a {100} plane is no more than 5 degrees, the plurality of diamond monocrystals are joined by a diamond polycrystalline film having crystals with random orientation formed by a vapor phase synthesis on the second face parallel to the faces of the plurality of diamond monocrystals,
 an entire surface of the first main face is integrated by vapor-phase synthesized diamond monocrystals grown using the diamond monocrystalline substrate as a seed crystal, and
 a spacing between the main faces is a thickness of the diamond monocrystalline substrate and at least 0.1 mm and no more than 1 mm.

12. A diamond composite substrate according to claim 11, wherein the orientation of the faces of the plurality of diamond monocrystals is {100}.

13. A diamond composite substrate according to claim 11, wherein a thickness of the diamond polycrystalline film formed by the vapor phase synthesis over the plurality of diamond monocrystals is at least 0.1 mm and no more than 1 mm.

14. A diamond composite substrate according to claim 11, wherein a ratio of the thickness of the plurality of diamond monocrystals to the thickness of the diamond polycrystalline film is between 1:1 and 1:4.

15. A diamond composite substrate according to claim 11, wherein a gap between the plurality of diamond monocrystals is no more than 500 µm.

16. A diamond composite substrate according to claim 11, wherein a difference in the thickness between the plurality of diamond monocrystals is no more than 10 µm.

17. A diamond composite substrate according to claim 11, wherein a surface of the diamond polycrystalline film has been polished.

18. A diamond composite substrate according to claim 11, wherein a surface roughness Rmax of the diamond polycrystalline film is no more than 0.1 µm.

19. A method for manufacturing a diamond composite substrate having first and second opposed main faces,
 lining up a plurality of diamond monocrystals having a same orientation;
 forming a diamond polycrystalline film having crystals with random orientation by a vapor phase synthesis over the plurality of diamond monocrystals; and
 joining the plurality of diamond monocrystals with the diamond polycrystalline film having crystals with random orientation,
 wherein the diamond monocrystals have a thickness of at least 0.1 mm and no more than 1 mm.

20. A method for manufacturing a diamond composite substrate according to claim 19, wherein a deviation between the respective orientations of the plurality of diamond monocrystals in a direction of rotation with respect to an axis perpendicular to faces thereof having a largest surface area, is no more than 2 degrees, and a difference between orientations of the respective faces of the plurality of diamond monocrystals and an orientation of a {100} plane is no more than 5 degrees.

21. A method for manufacturing a diamond composite substrate according to claim 20, wherein the face having the largest surface area of the respective faces of the plurality of the diamond monocrystals is the {100} plane.

22. A method for manufacturing a diamond composite substrate according to claim 19, wherein a thickness of the diamond polycrystalline film formed by the vapor phase synthesis over the plurality of diamond monocrystals is at least 0.1 mm and no more than 1 mm.

23. A method for manufacturing a diamond composite substrate according to claim 21, wherein a ratio of the thickness of the plurality of diamond monocrystals to the thickness of the diamond polycrystalline film is between 1:1 and 1:4.

24. A method for manufacturing a diamond composite substrate according to claim 19, wherein a difference in thickness between the plurality of diamond monocrystals is no more than 10 μm.

25. A method for manufacturing a diamond composite substrate according to claim 19, wherein a gap between the plurality of diamond monocrystals is no more than 500 μm.

26. A diamond composite substrate according to claim 1, wherein the diamond polycrystalline film has no monocrystalline layer and is distinct from the diamond monocrystalline substrate in a cross section.

* * * * *